United States Patent
Cochran et al.

(10) Patent No.: US 7,130,231 B2
(45) Date of Patent: Oct. 31, 2006

(54) METHOD, APPARATUS, AND COMPUTER PROGRAM PRODUCT FOR IMPLEMENTING ENHANCED DRAM INTERFACE CHECKING

(75) Inventors: William Hugh Cochran, Rochester, MN (US); William Paul Hovis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 10/994,087

(22) Filed: Nov. 19, 2004

(65) Prior Publication Data
US 2006/0109726 A1 May 25, 2006

(51) Int. Cl.
*G11C 7/00* (2006.01)
(52) U.S. Cl. ........................... 365/201; 365/149
(58) Field of Classification Search ........... 365/201, 365/149, 230.09
See application file for complete search history.

(56) References Cited

U.S. PATENT DOCUMENTS

| | | | | |
|---|---|---|---|---|
| 5,381,421 A | * | 1/1995 | Dickol et al. | 714/744 |
| 6,400,625 B1 | * | 6/2002 | Arimoto et al. | 365/201 |
| 6,404,684 B1 | * | 6/2002 | Arimoto et al. | 365/201 |
| 6,486,493 B1 | * | 11/2002 | Arimoto et al. | 257/48 |

\* cited by examiner

*Primary Examiner*—Anh Phung
(74) *Attorney, Agent, or Firm*—Joan Pennington

(57) ABSTRACT

A method, apparatus, and computer program product are provided for implementing an enhanced DRAM interface checking. An interface check mode enables interface checking using a refresh command for a DRAM. A predefined address pattern is provided for the interface address inputs during a refresh command cycle. Interface address inputs are checked for a proper value being applied and an error is signaled for unexpected results. An extended test mode includes further testing during a cycle after the refresh command cycle. Then command inputs also are checked for a proper value being applied and an error is signaled for unexpected results.

17 Claims, 9 Drawing Sheets

NORMAL DRAM OPERATION WITH PRIOR ART REFRESH COMMAND

| Cycle number | Bank Addr Pins | Other Addr Pins | Command Pins | Data Pins | Notes |
|---|---|---|---|---|---|
| 0 | Don't Care | Don't Care | NOP (or CS stays high) | Don't Care | All address and command could be in use by another rank of memory sharing everything except CS. |
| 1 | Don't Care | Don't Care | NOP (or CS stays high) | Don't Care | Same as note on cyc 0 |
| 2 | Don't Care | Don't Care | RFH Cmd (CS low with R low, C, low, W high) | Don't Care | Data pins could be in use from another rank of memory. |
| 3 | Don't Care | Don't Care | NOP (or CS goes high) | Don't Care | Same as note on cyc 0 |
| 4 | Don't Care | Don't Care | NOP (or CS goes high) | Don't Care | Same as note on cyc 0 |
| 5 | Don't Care | Don't Care | NOP (or CS goes high) | Don't Care | Same as note on cyc 0 |

PRIOR ART

FIG. 2

ENHANCED DRAM INTERFACE CHECKING AROUND REFRESH COMMAND

| Cyc# | Bank Addr Pins | Other Addr Pins | Command Pins | Data Pins | Notes |
|---|---|---|---|---|---|
| 0 | Don't Care | Don't Care | NOP (or CS stays high) | Don't Care | All address and command could be in use by another rank of memory sharing everything except CS. |
| 1 | Don't Care | Don't Care | NOP (or CS stays high) | Don't Care | Same as note on cyc 0 |
| 2 | Must Assert Correct Expected Pattern | Must Assert Correct Expected Pattern | RFH Cmd (CS low with R low, C, low, W high) | Don't Care | Data pins could be in use from another rank of memory. |
| 3 | Don't Care | Don't Care | NOP (or CS goes high) | Don't Care | Same as note on cyc 0 |
| 4 | Don't Care | Don't Care | NOP (or CS goes high) | Don't Care | Same as note on cyc 0 |
| 5 | Don't Care | Don't Care | NOP (or CS goes high) | Don't Care | Same as note on cyc 0 |

FIG. 3

EXEMPLARY EXPECTED PATTERNS REQUIRED ON DRAM INTERFACE WITH THE INTERFACE CHECK MODE ENABLED

| Cyc # | Bank Addr Pins | Other Addr Pins | Command Pins | Data Pins | Notes |
|---|---|---|---|---|---|
| N | 00 | 000000000000000 | RFH Cmd (CS low with R low, C, low, W high) | Don't Care | Data pins could be in use from another rank of memory. |
| N + 1 RFH INT | 11 | 111111111111111 | RFH Cmd (CS low with R low, C, low, W high) | Don't Care | Data pins could be in use from another rank of memory. |
| N + 2 RFH INT | 01 | 000000000000001 | RFH Cmd (CS low with R low, C, low, W high) | Don't Care | Data pins could be in use from another rank of memory. |
| N + 3 RFH INT | 10 | 111111111111110 | RFH Cmd (CS low with R low, C, low, W high) | Don't Care | Data pins could be in use from another rank of memory. |
| N + 4 RFH INT | 10 | 000000000000010 | RFH Cmd (CS low with R low, C, low, W high) | Don't Care | Data pins could be in use from another rank of memory. |
| N + 5 RFH INT | 01 | 111111111111101 | RFH Cmd (CS low with R low, C, low, W high) | Don't Care | Data pins could be in use from another rank of memory. |

FIG. 4

ENHANCED EXTENDED DRAM INTERFACE CHECKING AROUND REFRESH COMMAND

| Cyc # | Bank Addr Pins | Other Addr Pins | Command Pins | Data Pins | Notes |
|---|---|---|---|---|---|
| 0 | Don't Care | Don't Care | NOP (or CS stays high) | Don't Care | All address and command could be in use by another rank of memory sharing everything except CS. |
| 1 | Don't Care | Don't Care | NOP (or CS stays high) | Don't Care | Same as note on cyc 0 |
| 2 | Must Assert Correct Exptd. Pattern | Must Assert Correct Expected Pattern | Refresh Cmd (CS low with R low, C, low, W high) | Don't Care | Data pins could be in use from another rank of memory. |
| 3 | Must Assert Correct Exptd. Pattern | Must Assert Correct Expected Pattern | Must Assert Correct Expected Pattern | Don't Care | Same as note on cyc 0 |
| 4 | Don't Care | Don't Care | NOP (or CS goes high) | Don't Care | Same as note on cyc 0 |
| 5 | Don't Care | Don't Care | NOP (or CS goes high) | Don't Care | Same as note on cyc 0 |

FIG. 5

EXEMPLARY EXPECTED PATTERNS REQUIRED ON DRAM INTERFACE WITH THE EXTENDED INTERFACE CHECK MODE ENABLED

| Cyc # | Bank Addr Pins | Other Addr Pins | Command Pins | Data Pins | Notes |
|---|---|---|---|---|---|
| 1st RFH Cmd | 00 | 0000000000000000 | Refresh Cmd (CS low with R low, C, low, W high) | Don't Care | Data pins could be in use from another rank of memory. |
| 1st RFH Cmd plus one cycle | 11 | 1111111111111111 | CS, R, C, W, CE = 00000 | Don't Care | Data pins could be in use from another rank of memory. Command bus unavailable. |
| 2nd RFH Cmd | 01 | 0000000000000001 | Refresh Cmd (CS low with R low, C, low, W high) | Don't Care | Data pins could be in use from another rank of memory. |
| 2nd RFH Cmd plus one cycle | 10 | 1111111111111110 | CS, R, C, W, CE = 11111 | Don't Care | Data pins could be in use from another rank of memory. Command bus unavailable. |
| 3rd RFH Cmd | 10 | 0000000000000010 | Refresh Cmd (CS low with R low, C, low, W high) | Don't Care | Data pins could be in use from another rank of memory. |

FIG. 6A

| 3rd RFH Cmd plus one cycle | 01 | 1111111111111101 | CS, R, C, W, CE = 00001 | Don't Care | Data pins could be in use from another rank of memory. Command bus unavailable. |
|---|---|---|---|---|---|
| 4th RFH Cmd | 11 | 0000000000000011 | Refresh Cmd (CS low with R low, C, low, W high) | Don't Care | Data pins could be in use from another rank of memory. |
| 4th RFH Cmd plus one cycle | 00 | 1111111111111100 | CS, R, C, W, CE = 11110 | Don't Care | Data pins could be in use from another rank of memory. Command bus unavailable. |

FIG. 6B

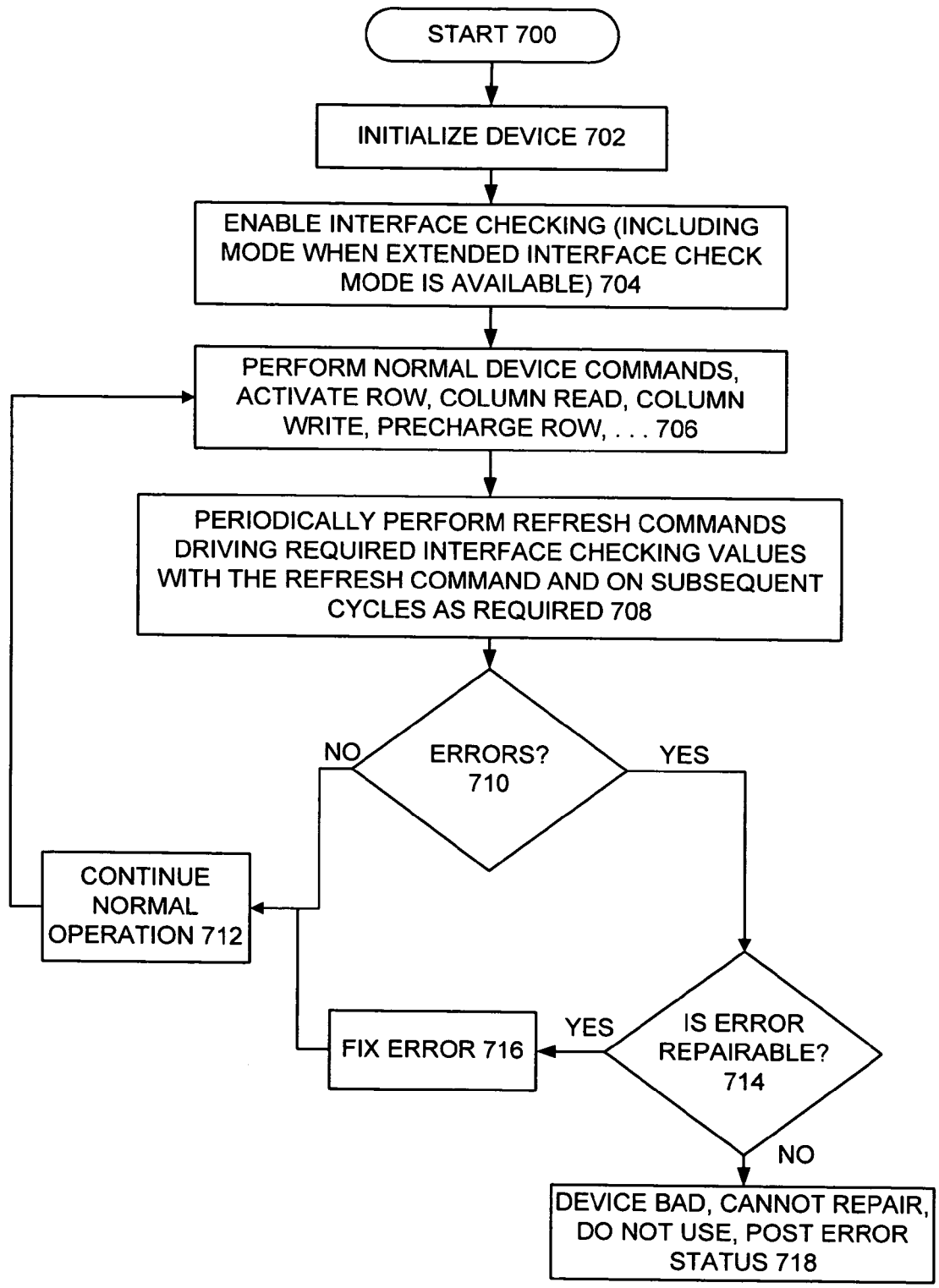

METHOD, APPARATUS, AND COMPUTER PROGRAM PRODUCT FOR IMPLEMENTING ENHANCED DRAM INTERFACE CHECKING

FIELD OF THE INVENTION

The present invention relates generally to the data processing field, and more particularly, relates to a method, apparatus, and computer program product for implementing enhanced dynamic random access memory (DRAM) interface checking in a computer system.

DESCRIPTION OF THE RELATED ART

In conventional arrangements, during manufacture of integrated circuits, manufacturers rely on sophisticated testers to test the chips via external pins. Test data are applied via external pins to the inputs and the outputs are observed. Typical manufacturing defects include shorts, opens, stuck-at-1, stuck-at-0, and the like. Further testing during normal operation of integrated circuits is needed to confirm proper function.

Dynamic random access memory chips (DRAMs) are commonly used memory components. Various algorithms have been derived to enable functional testing of DRAM modules, for example, algorithms write specific patterns to a DRAM array and then check the read data for accuracy. Typically such functional testing algorithms require a significant amount of time to test a large memory array and are not performed on a real time basis.

It is desirable to simply check the DRAM interface integrity of a DRAM without adding any pins and with a minimal amount of logic. It is desirable to determine if any of the address pins or command pins to the device are either open or shorted out. It is desirable to allow for fault isolation where multiple devices are affected and that enables the possibility for the repair of broken address or command lines A need exists for an effective mechanism for implementing enhanced dynamic random access memory (DRAM) interface checking. It is desirable to provide such a mechanism that enables effective fault isolation and that does not require adding any pins to the DRAM interface.

SUMMARY OF THE INVENTION

Principal aspects of the present invention are to provide a method, apparatus, and computer program product for implementing enhanced DRAM interface checking. Other important aspects of the present invention are to provide such method, apparatus, and computer program product for implementing enhanced DRAM interface checking substantially without negative effect and that overcome some of the disadvantages of prior art arrangements.

In brief, a method, apparatus, and computer program product are provided for implementing enhanced dynamic random access memory (DRAM) interface checking. An interface check mode enables interface checking using a refresh command for a DRAM. A predefined address pattern is provided for the interface address inputs during a refresh command cycle. Interface address inputs are checked for a proper value being asserted and an error is signaled for unexpected results.

In accordance with features of the invention, an extended test mode includes further testing during a cycle after the refresh command cycle. Checking of both the address inputs and command inputs are provided by the extended test mode. Then command inputs are checked for a proper value being asserted and an error is signaled for unexpected results.

BRIEF DESCRIPTION OF THE DRAWINGS

The present invention together with the above and other objects and advantages may best be understood from the following detailed description of the preferred embodiments of the invention illustrated in the drawings, wherein:

FIG. 2 illustrates a prior art DRAM operation around a refresh command where addresses during refresh commands are normally unused pins not driven or a don't care;

FIG. 3 illustrates an exemplary DRAM interface checking mode around a refresh command for implementing enhanced DRAM interface checking in accordance with a first preferred embodiment in the computer system of FIG. 1;

FIG. 4 illustrates exemplary expected patterns required on the DRAM interface with the DRAM interface check mode of FIG. 3 enabled for implementing enhanced DRAM interface checking in accordance with the preferred embodiment FIG. 5 illustrates an exemplary extended DRAM interface checking mode around a refresh command for implementing enhanced DRAM interface checking in accordance with another preferred embodiment in the computer system of FIG. 1;

FIGS. 6A and 6B illustrate exemplary expected patterns required on the DRAM interface with the extended DRAM interface check mode of FIG. 5 enabled for implementing enhanced extended DRAM interface checking in accordance with the preferred embodiment;

FIG. 7 is a flow chart illustrating exemplary steps for implementing enhanced DRAM interface checking in accordance with the preferred embodiments in the computer system of FIG. 1.

DETAILED DESCRIPTION OF THE PREFERRED EMBODIMENTS

In accordance with features of the preferred embodiment, a new check mode on the DRAM interface is provided so that the addresses are no longer a don't care during refresh commands. A predefined address pattern is provided for the interface address inputs during a refresh command. Interface address inputs are checked for a proper value being asserted and an error is signaled for unexpected results. In an extended check mode, the cycle after the refresh command also is utilized for further checking of the address and also the command lines with a minimal impact to the command interface bandwidth. Both extended testing modes advantageously can be made optional in nature.

Figure 1:
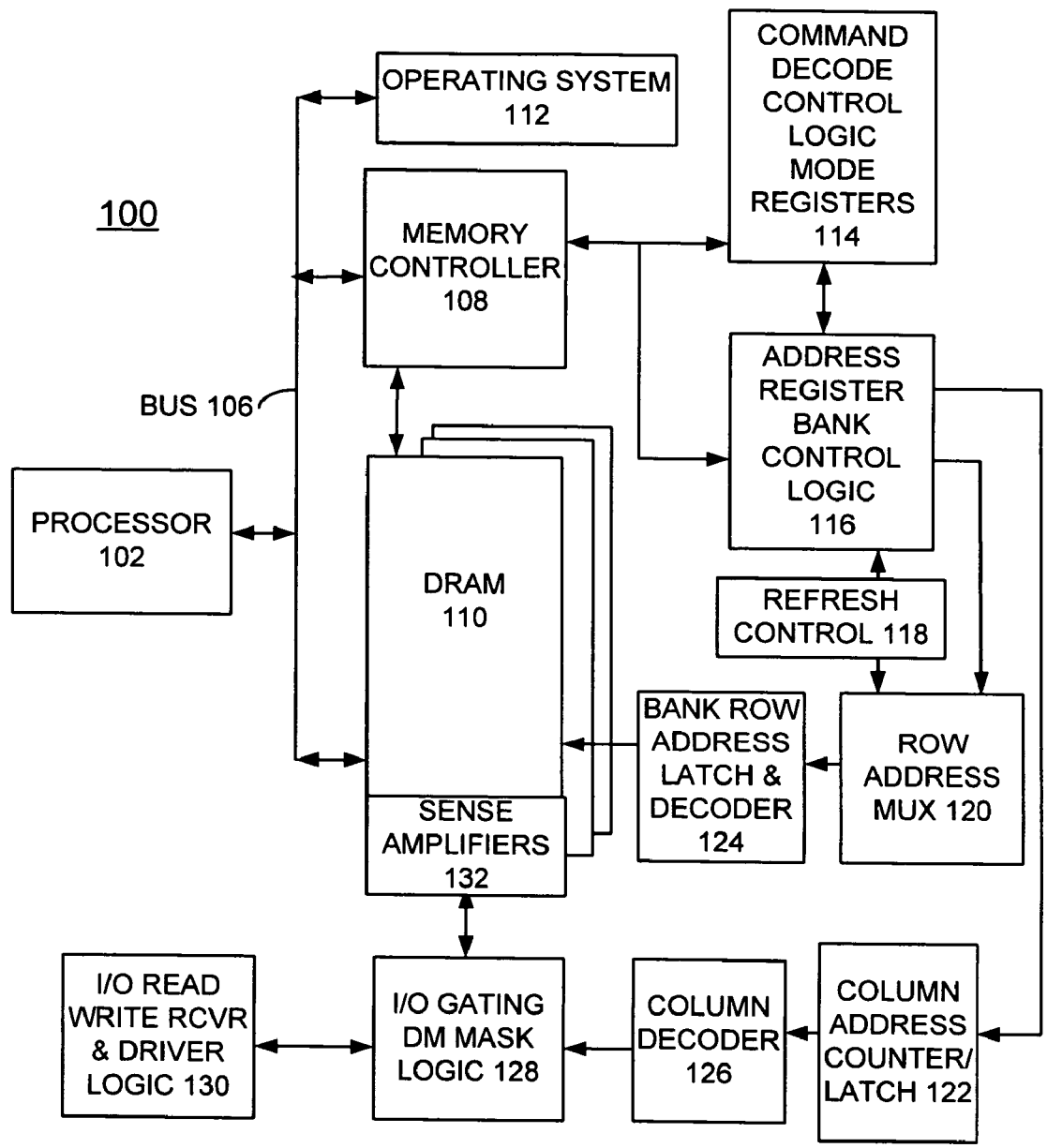
FIG. 1 is a block diagram representation illustrating a computer system for implementing enhanced DRAM interface checking in accordance with the preferred embodiments.

Referring now to the drawings, in FIG. 1 there is shown a computer system generally designated by the reference character 100 for implementing enhanced DRAM interface checking in accordance with the preferred embodiments. Computer system 100 includes a processor 102 or central processor unit (CPU) 102 coupled by a system bus 106 to a memory controller 108 and system memory including a dynamic random access memory (DRAM) 110. Computer system 100 includes an operating system 112.

As shown in FIG. 1, memory controller 108 is coupled to a command decode, control logic, and mode register functional block 114 and an address register and bank control logic 116. A refresh control 118 of the preferred embodiment is coupled to the address register and bank control logic 116 and to a row address multiplexer (mux) 120. The command decode, control logic, and mode register functional block 114 also is operatively coupled to the row address mux 120 and a column address counter and latch 122. Row address mux 120 is coupled to a bank row address latch and decoder 124 providing bank row to the DRAM 110. The column address counter and latch 122 provides inputs to a column decoder 126. An I/O gating DM mask logic 128 coupled to the column decoder 126 and an I/O read/write receiver and driver logic 130 provides column address inputs and data inputs to sense amplifier 132 of DRAM 110.

Computer system 100 is shown in a form sufficient for understanding the present invention. The illustrated computer system 100 is not intended to imply architectural or functional limitations. The present invention can be used with various hardware implementations and systems and various other internal hardware devices. It should be understood that the present invention is not limited to use in the illustrated computer system 100, various processor systems can provide a computing environment in which the methods and enhanced DRAM interface checking of the preferred embodiments of the invention advantageously are implemented.

Processor 102 can be implemented with various standard processors, for example, with one of the PowerPC® line of processors manufactured by International Business Machines Corporation.

In accordance with features of the preferred embodiment, additional checks in the DRAM 110 of the preferred embodiment are created that help insure the integrity of the DRAM interface over time. Specifically, refresh commands are used to check that addresses being driven are valid.

FIG. 2 illustrates prior art DRAM operation around a refresh command. Addresses during refresh commands are normally unused pins not driven or a don't care as shown in the prior art DRAM operation of FIG. 2.

FIGS. 3 and 4 illustrate an optional enhanced DRAM interface check mode of the preferred embodiment, for example, enabled with Mode Register Set/Extended Mode Register Set (MRS/EMRS) associated with both required initialization commands and a means to enable various optional functions and features within DRAM 110, such as industry standard main memory SDR SDRAMs, DDR SDRAMs, DDR2 SDRAMs, and like future devices as well DDR3 SDRAMs, and graphics versions of these chips. As shown in FIG. 3, with the refresh command (RFH Cmd) asserted in cycle 2, the bank address pins and other address pins must assert a correct expected pattern.

FIG. 4 illustrates exemplary expected patterns required on DRAM interface with the interface check mode enabled. As shown in FIG. 4, the following address pattern is required be driven to the DRAM 110: 1 st refresh—address 0, then 1 on the second refresh, 2 on the third refresh, and the like. It should be understood that various other required address patterns can be provided to the DRAM 110, such as drive 0 on the first refresh, complement 0 on the second refresh, 1 on the third refresh, complement 1 on the 4th refresh, and the like.

In accordance with features of the preferred embodiment, the address patterns driven during the refresh command can be required either all the time or until the DRAM interface check mode is turned off. The address patterns driven during the refresh command are used to identify bad or stuck addresses, an error for unexpected results on the DRAM 110 is signaled back. Return error status can be indicated on a data strobe or detailed error status can be accessed via an available JTAG function of memory controller 108, including which line or lines had the improper value.

It should be understood that when a problem arises in the system 100 and then to check the integrity of the DRAM interface, a burst refresh could be initiated to determine that all address pins are being received correctly, for example, with no more than 64K refresh commands, at 200 ns per command, the entire process could be completed in 13 ms in burst mode.

Referring now to FIGS. 5, 6A and 6B, there are shown exemplary extended DRAM interface check mode and exemplary expected address and command patterns required on the DRAM interface with the extended DRAM interface check mode enabled in accordance with the preferred embodiment.

FIG. 5 illustrates the extended DRAM interface check mode where with the refresh command (RFH Cmd) asserted in cycle 2, the bank address pins and other address pins must assert a correct expected pattern and the bank address pins and other address pins must assert a correct expected pattern in cycle 3 following the RFH Cmd. In cycle 3 following the RFH Cmd, the command pins must assert a correct expected pattern. With the extended DRAM interface check mode, it can simply be determined if any of the command or address pins to the DRAM 110 are either open or shorted out. FIGS. 6A and 6B illustrates exemplary expected patterns required on DRAM interface with the extended DRAM interface check mode enabled for both the address pins and the command pins.

As shown in FIGS. 5, 6A and 6B, the refresh command itself can be the key that redefines the interface check mode for that refresh command cycle and for the cycle after the refresh command, to define checking in this extended interface check mode. Any pattern on the CS, RAS, CAS, W, and CE, command pins can be required. Also the requirement for an incrementing pattern can also be placed on these command pins comparable to what is described above for the addresses, for example, start with all pins low, count up, or count/complement, and the like. Since all but chip select (CS) may be common to other banks of DRAM 110, this should be optional as it prevents the other pins from being used during that cycle to initiate commands to other banks of memory. However, as infrequently as refreshes are performed, for example, once every 7–15 μsec, this extended DRAM interface check mode may not be a major performance issue, with a trade-off a minimal performance degradation for the integrity check. All the other issues associated with reporting status or taking action to repair the fault apply to this extended DRAM interface check mode.

Each of the above embodiments as shown in FIGS. 3 and 4, and FIGS. 5, 6A and 6B can be detected by a lack of an acknowledgement from the DRAM 110 or by an acknowledgement from the DRAM 110 to the memory controller 108. For example, the DRAM 110 can be set, via mode register of functional block 114, to the Interface Checking Mode (ICM) of FIGS. 3 and 4 once the DRAM is initialized. Once the DRAM 110 is set in ICM mode, DRAM 110 expects a predetermined pattern during each refresh command or extended refresh command. If the DRAM 110 does not see the expected pattern, DRAM can respond to the system 100 in one of two ways. The first response would be to drive the data bus to all 1's or all 0's ignoring any fetch commands. The length of the transfer could either be extended beyond what was expected or truncated as well. Then system 100 is required to recognize this pattern to realize that the DRAM interface is broken. The second and more likely preferred solution is for the DRAM 110 to use a Data Strobe or other predefined error line to signal the system 100 that the DRAM interface is not functional. Stores and fetches would not be permitted until the system resets the DRAM 110. It is also possible to make the choice of positive or negative acknowledgement programmed by the user, with for example, the preferred solution of positive acknowledgement would be the default.

Referring now to FIG. 7, there are shown exemplary steps for implementing enhanced DRAM interface checking in accordance with the preferred embodiment in the computer system 100 starting at a block 700. The device or DRAM 110 is initialized as indicated in a block 702. Next DRAM checking optionally is enabled if not defaulted on, including the DRAM interface checking mode or the extended DRAM interface checking mode, as indicated in a block 704. Normal device commands are performed as indicated in a block 706. Periodically refresh commands are performed driving required interface checking values with the refresh command, and on subsequent cycles as required for the extended DRAM interface checking mode as indicated in a block 708. Checking for errors is performed as indicated in a decision block 710. When an error is not identified, then normal operation continues as indicated in a block 712. When an error is identified, checking whether the error is repairable is performed as indicated in a decision block 714. If repairable, the error is fixed as indicated in a block 716 and normal operation continues at block 712. Otherwise when the error is not repairable, then an error status is posted as indicated in a block 718, for example, use the Data Strobe or other error line to signal the system 100 that the DRAM interface is not functional.

Figure 8:
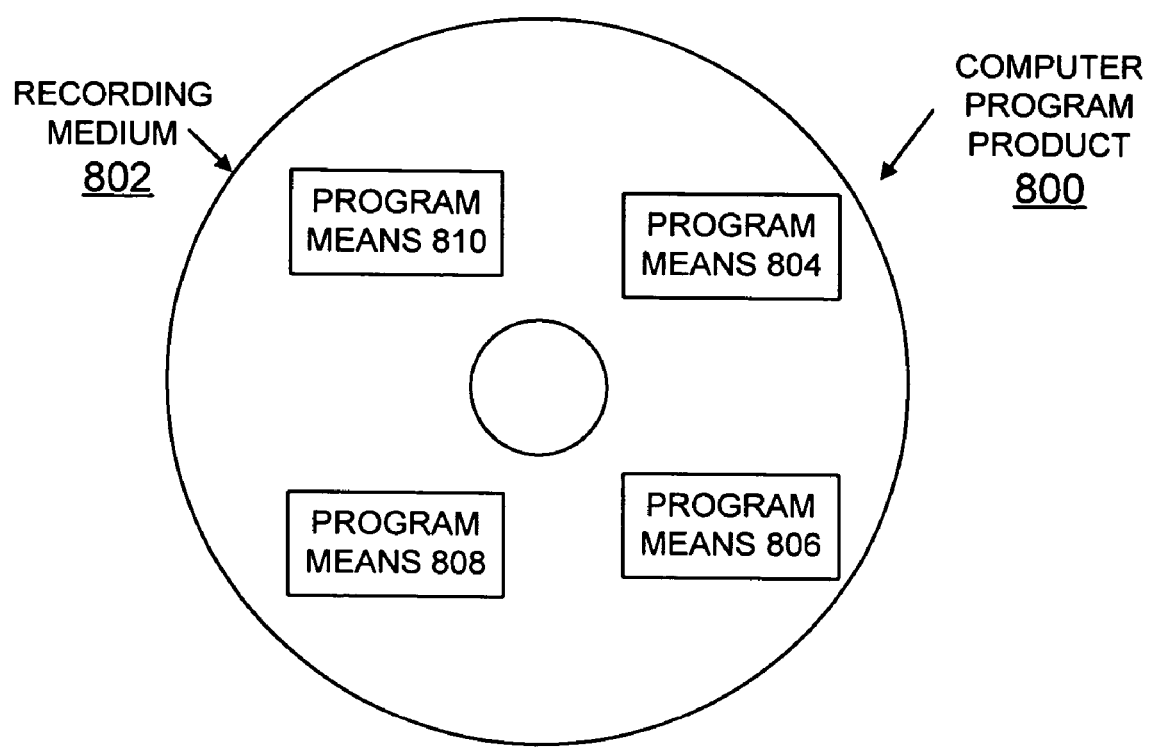
FIG. 8 is a block diagram illustrating a computer program product in accordance with the preferred embodiment.

Referring now to FIG. 8, an article of manufacture or a computer program product 800 of the invention is illustrated. The computer program product 800 includes a recording medium 802, such as, a floppy disk, a high capacity read only memory in the form of an optically read compact disk or CD-ROM, a tape, a transmission type media such as a digital or analog communications link, or a similar computer program product. Recording medium 802 stores program means 804, 806, 808, 810 on the medium 802 for carrying out the methods for implementing an enhanced DRAM interface checking of the preferred embodiment in the computer 100 of FIG. 1.

A sequence of program instructions or a logical assembly of one or more interrelated modules defined by the recorded program means 804, 806, 808, 810, direct the computer system 100 for implementing an enhanced DRAM interface checking of the preferred embodiment.

While the present invention has been described with reference to the details of the embodiments of the invention shown in the drawing, these details are not intended to limit the scope of the invention as claimed in the appended claims.

What is claimed is:

1. A method for implementing enhanced dynamic random access memory (DRAM) interface checking comprising the steps of:
   enabling an interface check mode for interface checking using a refresh command for a DRAM;
   providing a predefined address pattern for interface address inputs during a refresh command cycle; and
   checking interface address inputs for a proper value being asserted.

2. A method for implementing enhanced dynamic random access memory (DRAM) interface checking as recited in claim 1 further includes the steps of signaling an error for unexpected results.

3. A method for implementing enhanced dynamic random access memory (DRAM) interface checking as recited in claim 1 includes the steps of providing an incrementing address pattern for interface address inputs during sequential refresh command cycles.

4. A method for implementing enhanced dynamic random access memory (DRAM) interface checking as recited in claim 1 wherein the step of enabling an interface check mode for interface checking includes the step of enabling an extended interface check mode.

5. A method for implementing enhanced dynamic random access memory (DRAM) interface checking as recited in claim 4 includes the steps of providing a predefined command pattern for interface command inputs in a cycle following the refresh command cycle.

6. A method for implementing enhanced dynamic random access memory (DRAM) interface checking as recited in claim 5 includes the steps of providing one said predefined address pattern for interface address inputs during the cycle following the refresh command cycle.

7. A method for implementing enhanced dynamic random access memory (DRAM) interface checking as recited in claim 5 includes the steps of checking the interface command inputs for a proper value being asserted during the cycle following the refresh command cycle.

8. A method for implementing enhanced dynamic random access memory (DRAM) interface checking as recited in claim 7 further includes the steps of signaling an error for unexpected results.

9. A method for implementing enhanced dynamic random access memory (DRAM) interface checking as recited in claim 5 includes the steps of providing an incrementing command pattern for interface command inputs in a cycle following sequential refresh command cycles.

10. Apparatus for implementing enhanced dynamic random access memory (DRAM) interface checking comprising:
    a DRAM including a plurality of interface address inputs and a plurality of interface command inputs;
    a memory controller coupled to said DRAM for enabling an interface check mode for interface checking using a refresh command for said DRAM;
    said memory controller providing a predefined address pattern for interface address inputs during a refresh command cycle; and
    said memory controller checking interface address inputs for a proper value being asserted.

11. Apparatus for implementing enhanced dynamic random access memory (DRAM) interface checking as recited in claim 10 wherein said memory controller further signals an error for unexpected results.

12. Apparatus for implementing enhanced dynamic random access memory (DRAM) interface checking as recited in claim 10 wherein said memory controller enables an extended interface check mode; provides a predefined command pattern for interface command inputs in a cycle following the refresh command cycle; and checks interface command inputs for a proper value being asserted during the cycle following the refresh command cycle.

13. Apparatus for implementing enhanced dynamic random access memory (DRAM) interface checking as recited in claim 10 wherein said memory controller provides an incrementing address pattern for interface address inputs during sequential refresh command cycles.

14. A computer program product for implementing enhanced dynamic random access memory (DRAM) interface checking in a computer system, said computer program product including a plurality of computer executable instructions stored on a computer readable medium, wherein said instructions, when executed by the computer system, cause the computer system to perform the steps of:
enabling an interface check mode for interface checking using a refresh command for a DRAM;
providing a predefined address pattern for interface address inputs during a refresh command cycle; and
checking interface address inputs for a proper value being asserted.

15. A computer program product for implementing enhanced dynamic random access memory (DRAM) interface checking as recited in claim 14 includes the steps of enabling an extended interface check mode and providing a predefined command pattern for interface command inputs in a cycle following the refresh command cycle.

16. A computer program product for implementing enhanced dynamic random access memory (DRAM) interface checking as recited in claim 15 includes the step of checking interface command inputs for a proper value being asserted during the cycle following the refresh command cycle.

17. A computer program product for implementing enhanced dynamic random access memory (DRAM) interface checking as recited in claim 16 includes the steps of signaling an error for unexpected results.

* * * * *